US010334191B1

(12) United States Patent
Yang et al.

(10) Patent No.: US 10,334,191 B1
(45) Date of Patent: Jun. 25, 2019

(54) PIXEL ARRAY WITH EMBEDDED SPLIT PIXELS FOR HIGH DYNAMIC RANGE IMAGING

(71) Applicant: OmniVision Technologies, Inc., Santa Clara, CA (US)

(72) Inventors: Dajiang Yang, San Jose, CA (US); Zhiyong Zhan, Milpitas, CA (US); Chen-wei Lu, San Jose, CA (US); Duli Mao, Sunnyvale, CA (US); Xin Wang, San Jose, CA (US); Keiji Mabuchi, Los Altos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/910,883

(22) Filed: Mar. 2, 2018

(51) Int. Cl.
*H04N 5/335* (2011.01)
*H04N 5/355* (2011.01)
*H01L 27/146* (2006.01)
*H04N 5/378* (2011.01)

(52) U.S. Cl.
CPC ..... *H04N 5/35563* (2013.01); *H01L 27/1461* (2013.01); *H01L 27/1463* (2013.01); *H01L 27/1464* (2013.01); *H01L 27/14607* (2013.01); *H01L 27/14627* (2013.01); *H01L 27/14643* (2013.01); *H04N 5/378* (2013.01)

(58) Field of Classification Search
CPC ............. H04N 5/35563; H04N 5/378; H01L 27/14607; H01L 27/1461; H01L 27/14627; H01L 27/1463; H01L 27/1464; H01L 27/14643

USPC ......................................................... 348/301
See application file for complete search history.

(56) References Cited

U.S. PATENT DOCUMENTS

| 2009/0090841 | A1* | 4/2009 | Kusaka | G01C 3/08 |
| | | | | 250/201.2 |
| 2016/0360134 | A1* | 12/2016 | Miyake | H01L 27/14603 |
| 2017/0324917 | A1* | 11/2017 | Mlinar | H04N 5/3592 |
| 2017/0366769 | A1* | 12/2017 | Mlinar | H04N 5/35563 |
| 2017/0373105 | A1* | 12/2017 | Galor Gluskin | |
| | | | | H01L 27/14603 |
| 2018/0269245 | A1* | 9/2018 | Mlinar | H01L 27/14607 |

* cited by examiner

*Primary Examiner* — Usman A Khan
(74) *Attorney, Agent, or Firm* — Christensen O'Connor; Johnson Kindness PLLC

(57) ABSTRACT

A pixel cell includes a second photodiode laterally surrounding a first photodiode in semiconductor material. The first and second photodiodes are adapted to photogenerate image charge in response to incident light. A floating diffusion is disposed in the semiconductor material proximate to an outer perimeter of the second photodiode. A first transfer gate is disposed proximate to the semiconductor material over a first channel region between the first and second photodiodes. The first transfer gate is coupled to transfer the image charge from the first photodiode to the second photodiode. A second transfer gate is disposed proximate to the semiconductor material over a second channel region between the second photodiode and the floating diffusion. The second transfer gate is coupled to transfer the image charge from the second photodiode to the floating diffusion.

31 Claims, 6 Drawing Sheets

PIXEL ARRAY WITH EMBEDDED SPLIT PIXELS FOR HIGH DYNAMIC RANGE IMAGING

BACKGROUND INFORMATION

Field of the Disclosure

The present invention is generally related to image sensors, and more specifically, the present invention is directed to high dynamic range image sensors.

Background

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range. The most common technique to increase dynamic range is to merge multiple exposures captured with different exposure settings using standard (low dynamic range) image sensors into a single linear HDR image, which results in a much larger dynamic range image than a single exposure image.

Another HDR technique incorporates different exposure integration times or different light sensitivities (for example by inserting neutral density filters) into a single image sensor. The single image sensor could have in effect 2, 3, 4 or even more different exposures in the single image sensor. Thus, multiple exposure images are available in a single shot using this HDR image sensor. However, the overall image resolution is decreased using this HDR sensor compared to a normal full resolution image sensor. For example, for an HDR sensor that combines 4 different exposures into one image sensor, each HDR image would be only a quarter resolution of the full resolution image.

Other approaches to implement HDR image sensors present many other challenges. These other approaches are not space efficient and are difficult to miniaturize to a smaller pitch to achieve higher resolutions. In addition, due to the asymmetric layouts of many of these HDR image sensors, reducing the size and pitch of the pixels to realize high resolution image sensors result in crosstalk and other unwanted side effects, such as diagonal flare that can occur in these image sensors as the pitches are reduced. Furthermore, many HDR image sensors require structures with very large full well capacities (FWC) to accommodate the large dynamic ranges. However, the large FWC requirements cause lag, white pixels (WP), dark current (DC), and other unwanted problems. Thus, these other HDR imaging approaches are also not suitable for high resolutions because of the high FWC requirements that are difficult to scale.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
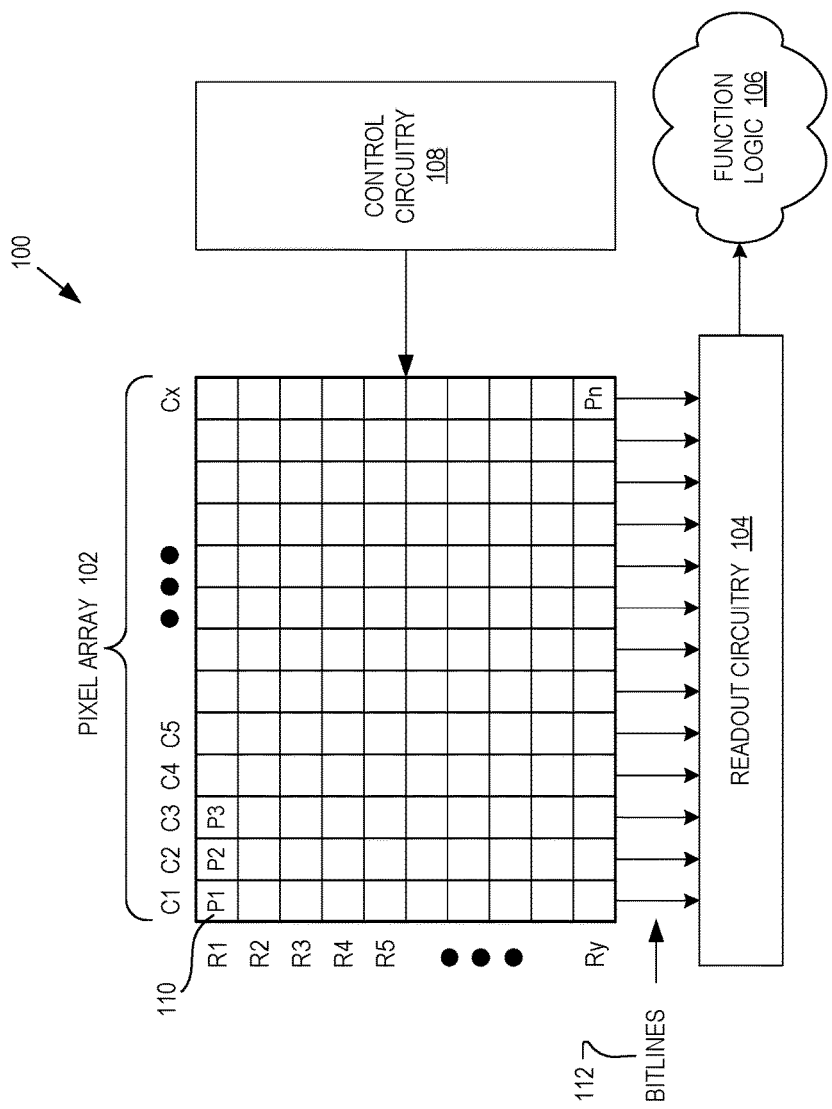
FIG. 1 is a block diagram illustrating an example high dynamic range (HDR) imaging system that detects high intensity illumination using a pixel array with embedded split diode pixel cells in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses directed to a pixel array with embedded split diode pixel cells for high dynamic range imaging are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be shown, examples of pixel cells including embedded split diodes that can be used for high dynamic range imaging are disclosed. In various examples, the embedded split diode structures include a small photodiode embedded in a large photodiode with a layout having increased symmetry compared to other known split diode designs, which reduces the diagonal flare issues that can occur from crosstalk between neighboring pixel cells. With the small photodiode embedded in the large photodiode, space is used more efficiently allowing smaller pitch and higher resolution high dynamic range (HDR) pixel arrays. As will be shown, the small photodiodes can be used to sense bright or high intensity light conditions, while the large photodiodes can be used to sense dimmer low to medium intensity light conditions to realize HDR imaging in accordance with the teachings of the present invention.

To illustrate, FIG. 1 illustrates a block diagram illustrating an example HDR system 100 that detects low/medium and high intensity illumination using a pixel array with embedded split diode pixel cells in accordance with the teachings of the present invention. Imaging system 100 may be implemented as complementary metal-oxide-semiconductor ("CMOS") image sensor. As shown in the example illustrated in FIG. 1, imaging system 100 includes pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, . . . , Pn). In one example, each pixel cell includes embedded split diodes that can be used for HDR imaging in accordance with the teachings of the present invention. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. As will be described in greater detail below, each pixel cell 110 (e.g., pixel cells P1, P2, . . . , Pn) may include a substantially symmetric split diode design with a small photodiode embedded in a large photodiode to provide HDR imaging in accordance with the teachings of the present invention.

In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the large and small photodiode of each embedded split diode pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

Figure 2:
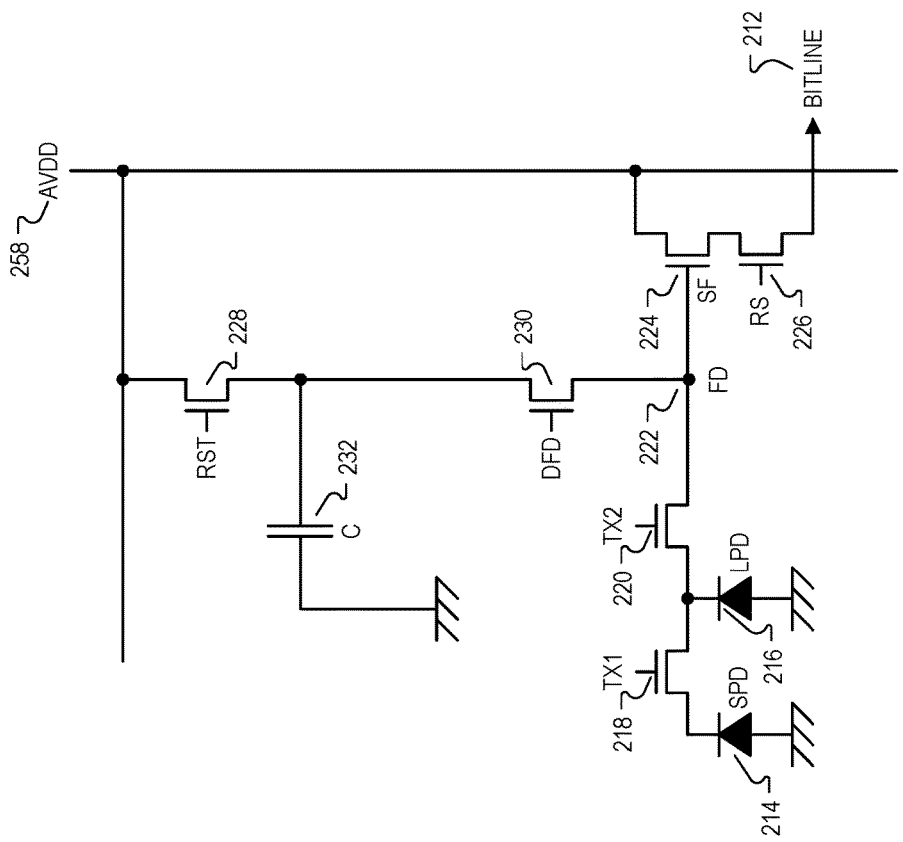
FIG. 2 is an illustrative schematic of an example pixel cell with embedded split diodes in accordance with the teachings of the present invention.

FIG. 2 is an illustrative schematic of an example pixel cell 210 with an embedded split diode design in accordance with the teachings of the present invention. It is appreciated that pixel cell 210 of FIG. 2 may be an example of a pixel cell 110 of FIG. 1, and that similarly named and numbered elements referenced below may be coupled and function similar to as described above. The illustrated example of the pixel cell 210 includes a first photodiode 214 and a second photodiode 216. In one example, first photodiode 214 and second photodiode 216 are split diodes, and first photodiode 214 is a small photodiode (SPD) that is embedded in second photodiode 216, which is a large photodiode (LPD). In operation, first and second photodiodes SPD 214 and LPD 216 are coupled to photogenerate image charge in response to incident light. The smaller first photodiode SPD 214 can be used to sense bright or high intensity light conditions, while the larger second photodiode LPD 216 can be used to sense dimmer low to medium intensity light conditions to provide image data for a high dynamic range (HDR) image.

Pixel cell 210 also includes a first transfer gate 218 coupled between first photodiode SPD 214 and second photodiode LPD 216, and a second transfer gate 220 coupled between second photodiode LPD 216 and floating diffusion FD 222. First transfer gate 218 is coupled to transfer image charge from first photodiode SPD 214 to second photodiode LPD 216 in response to a first transfer gate signal TX1. Second transfer gate 220 is coupled to transfer image charge from first photodiode SPD 214 to second photodiode LPD 216 in response to a second transfer gate signal TX2. A reset transistor 228 is coupled to the floating diffusion FD 222 to reset the pixel cell 210 (e.g., discharge or charge the first and second photodiodes SPD 216 and LPD 216, and the floating diffusion FD 222 to a preset voltage) in response to a reset signal RST. The gate terminal of an amplifier transistor 224 is coupled to the floating diffusion to generate an image data signal in response to the image charge in the floating diffusion FD 222. In the illustrated example, the amplifier transistor 224 is coupled as a source-follower (SF) coupled transistor. A row select transistor 226 is coupled to the amplifier transistor SF 224 to output the image data signal to an output bitline 212, which is coupled to readout circuitry such as readout circuitry 104 of FIG. 1, in response to a row select signal RS.

In another embodiment, a dual floating diffusion transistor 230 may optionally be coupled between the floating diffusion FD 222 and the reset transistor 228, and a capacitor C 232 may also be optionally included and coupled to the dual floating diffusion transistor 230. In operation, the dual floating diffusion transistor 230 is adapted to couple the capacitor C 232 to the floating diffusion FD 222 in response to a dual floating diffusion signal DFD to provide additional dynamic range capabilities to pixel cell 210 if desired. However, in another embodiment, it is appreciated that the dual floating diffusion transistor 230 and capacitor C 232 may be opted out if the full well capacity (FWC) of the first photodiode SPD 214 is sufficiently large with the photodiode dopant profiles adjusted accordingly.

Figure 3:
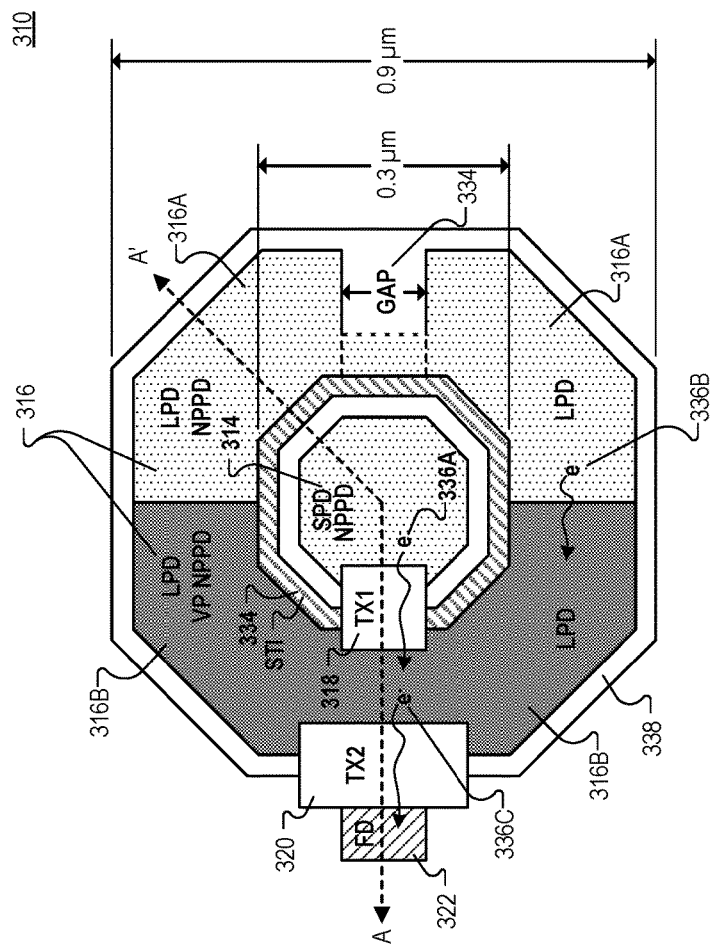
FIG. 3 is a layout view of an example embedded split diode pixel cell in accordance with the teachings of the present invention.

FIG. 3 is a layout view, or top view, of a portion of an example embedded split diode pixel cell 310 in accordance with the teachings of the present invention. It is appreciated that pixel cell 310 of FIG. 3 may be an example of pixel cell 210 of FIG. 2, or an example of pixel cell 110 of FIG. 1, and that similarly named and numbered elements referenced below may be coupled and function similar to as described above. As shown in the example depicted in FIG. 3, pixel cell 310 includes a first photodiode SPD 314 and a second photodiode LPD 316 disposed in the semiconductor material 338. In operation, first photodiode SPD 314 is a small photodiode, and second photodiode LPD 316 is a large photodiode, and are adapted to photogenerate image in response to incident light. In one example, first photodiode SPD 314 and a second photodiode LPD 316 are n-type pinned photodiodes (NPPDs). As shown in the illustrated example, second photodiode LPD 316 includes a first subregion NPPD 316A and a second subregion virtual phase (VP) NPPD 316B, which have different doping profiles and will be described in greater detail below. In operation, first photodiode SPD 314 is a small photodiode, and second photodiode LPD 316 is a large photodiode, and are adapted to photogenerate image charge (e.g., shown as charge e⁻ 336A, 336B, and 336C) in response to incident light.

As illustrated in the depicted example, first photodiode SPD 314 is embedded or formed within second photodiode LPD 316. The first photodiode SPD 314 and second photodiode LPD 316 are substantially symmetric around the center of first photodiode SPD 314 such that the second photodiode LPD 316 is an outer photodiode and the first photodiode SPD 314 is an inner photodiode centered within the outer photodiode. Accordingly, the second photodiode LPD 316 laterally surrounds the first photodiode SPD 314 in the semiconductor material 338 such that the second photodiode LPD 316 has an inner perimeter that is proximate to an outer perimeter of the first photodiode SPD 314 in the semiconductor material 338. As shown, the embedded design of pixel cell 310 enables a symmetric compact layout that is more space efficient that other asymmetric split diode layouts. Indeed, in one example the pitch of the pixel cell 310 is approximately 0.9 μm and the pitch of the embedded first photodiode SPD 314 is less than approximately 0.3 μm.

A floating diffusion FD 322 is disposed in the semiconductor material 338 proximate to an outer perimeter of the second photodiode 316. A first transfer gate TX1 318 is disposed proximate to the semiconductor material 338 over a first channel region (not shown) between the first and second photodiodes SPD 314 and LPD 316. In operation, the first transfer gate TX1 318 is coupled to transfer the image charge (e.g., charge 336A) from the first photodiode SPD 314 to the second photodiode LPD 316 in response to a first transfer gate signal. A second transfer gate TX2 320 is disposed proximate to the semiconductor material 338 over a second channel region (not shown) between the second photodiode LPD 316 and the floating diffusion FD 322. The second transfer gate TX2 320 is coupled to transfer the image charge (e.g., charge 336C) from the second photodiode LPD 316 to the floating diffusion FD 322 in response to a second transfer gate signal.

As illustrated in the example depicted in FIG. 3, pixel cell 310 also includes a shallow trench isolation (STI) region 334 disposed in the semiconductor material 338 between the first photodiode SPD 314 and the second photodiode LPD 316 to isolate the first and second photodiodes SPD 314 and LPD 316 from each other. It is appreciated of course that there are no STI regions 334 under the transfer gates TX1 318 and TX2 320 in order to allow the transfer of image charge 336A from first photodiode SPD 314 to second photodiode LPD 316, and the transfer of image charge 336C from second photodiode LPD 316 to the floating diffusion FD 322. As discussed further below, the first and second photodiodes SPD 314 and LPD 316 may be isolated further with p-wells (not visible in FIG. 3) disposed in the semiconductor material 338 surrounding the first and second photodiodes SPD 314 and LPD 316.

FIG. 3 also illustrates that in one example, the second photodiode LPD 316 includes a gap 334 in a region on a laterally opposite side of the second photodiode LPD 316 from the first and second transfer gates TX1 318 and TX2 320 such that a dopant concentration in the second photodiode LPD 316 is reduced towards the gap 334 away from the first and second transfer gates TX1 318 and TX2 320. In particular, during manufacturing processing, the dopants in the second photodiode LPD 316 will diffuse toward the gap 334 from adjacent implanted regions to cover the gap during thermal processing steps. As such, the dopant concentration may be further reduced in the region of second photodiode LPD 316 proximate to gap 334 that is furthest from the first and second transfer gates TX1 318 and TX2 320.

As shown in the depicted example, the gap 334 extends laterally from the output perimeter of the second photodiode LPD 316 towards the inner perimeter of the second photodiode LPD 316. In other words, the gap 334 as shown in the example in FIG. 3 forms a partial notch on the outer perimeter of second photodiode LPD 316 opposite the first and second transfer gates TX1 318 and TX2 320. It is appreciated that in another example, the gap 334 may extend completely from the outer perimeter of the second photodiode LPD 316 to the inner perimeter of the second photodiode LPD 316, which is indicated in FIG. 3 with the dashed line region of gap 334 being completely removed.

As mentioned previously, first and second photodiodes SPD 314 and LPD 316 are n-type pinned photodiodes (NPPDs). The first and second photodiodes SPD 314 and LPD 316 are implemented with shallower NPPD implant regions proximate to a front side surface of the semiconductor material 338 as well as deep NPPD (DNPPD) implant regions (not visible in FIG. 3) in the semiconductor material 338 beneath the shallower NPPD implant regions that are visible in FIG. 3. In addition, the shallower NPPD implant regions of second photodiode LPD 316 are implemented with first subregion NPPD 316A and second subregion VP NPPD 316B. As shown in the depicted example, the gap 334 is disposed in the first subregion NPPD 316A, and the first and second transfer gates TX1 318 and TX2 320 are disposed proximate to the second subregion VP NPPD 316B.

In one example, the second subregion VP NPPD 316B has a higher dopant concentration than first subregion NPPD 316A. The different dopant concentrations between the first subregion NPPD 316A and the second subregion VP NPPD 316B contributes to an electric field gradient in the second photodiode LPD 316 that drives the charge carriers (e.g., charge 336B) towards the first and second transfer gates TX1 318 and TX2 320, thus reducing lagging issues in pixel cell 310. Indeed, as illustrated in FIG. 3, electron (e) charge carriers 336B are driven in the second photodiode LPD 316 from the second subregion VP NPPD 316B towards the first subregion NPPD 316A towards the first and second transfer gates TX1 318 and TX2 320 due do the electric field gradient created between first subregion NPPD 316A and second subregion VP NPPD 316B. In the first photodiode SPD 314, the NPPD implant concentration is uniform but may be different than the second photodiode LPD 316 NPPD and VP NPPD implant concentration profiles.

Figure 4:
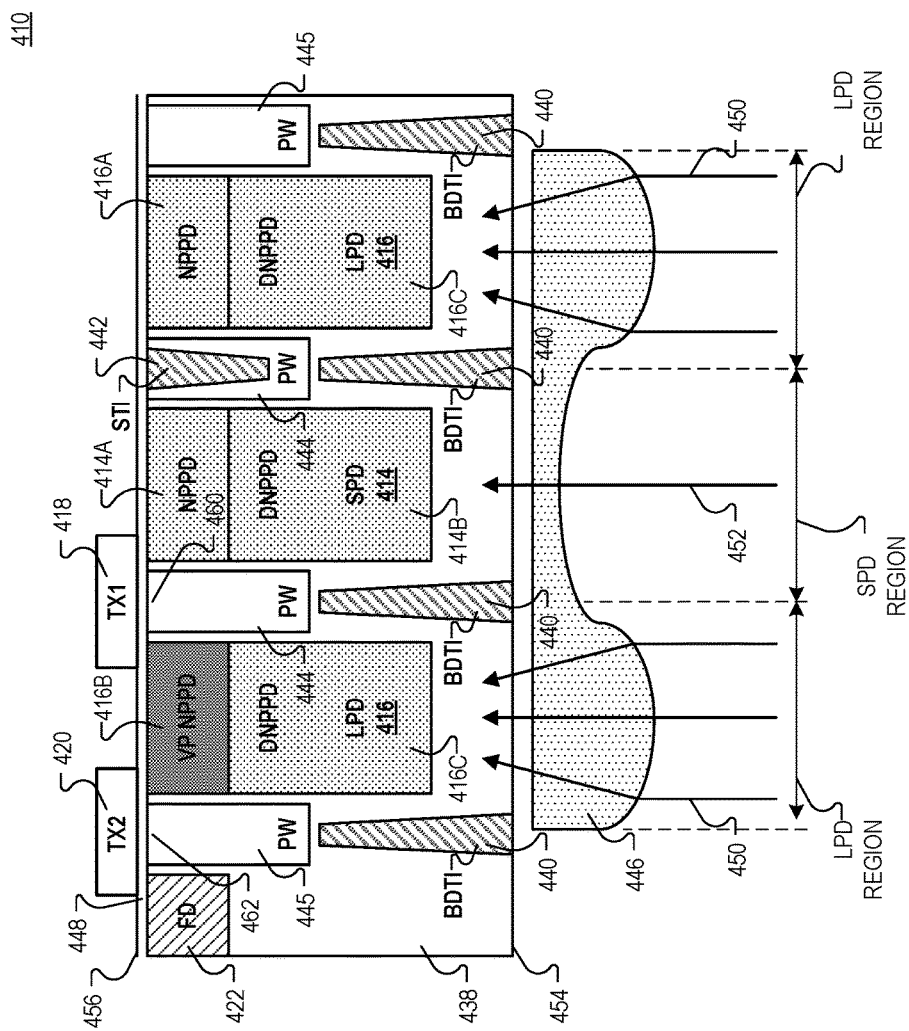
FIG. 4 a cross-section view of an example embedded split diode pixel cell in accordance with the teachings of the present invention.

FIG. 4 a cross-section view, or side view, of a cutout of a portion of an example pixel cell 410 along dashed line A-A' of the example embedded split diode pixel cell 310 illustrated in FIG. 3 in accordance with the teachings of the present invention. Thus, it is appreciated that pixel cell 410 of FIG. 4 may be an example of pixel cell 310 of FIG. 3, or an example of pixel cell 210 of FIG. 2, or an example of pixel cell 110 of FIG. 1, and that similarly named and numbered elements referenced below may be coupled and function similar to as described above. As shown in the example depicted in FIG. 4, pixel cell 410 includes a first photodiode SPD 414 and a second photodiode LPD 416 disposed in the semiconductor material 438. As shown in the illustrated example, incident light 452 is directed to the first photodiode SPD 414 and incident light 450 is directed to second photodiode through a backside 454 of the semiconductor material 438. In operation, first photodiode SPD 414 is a small photodiode, and second photodiode LPD 416 is a large photodiode, and are adapted to photogenerate image in response to incident light.

In the example depicted in FIG. 4, the first photodiode SPD 414 is an n-type pinned photodiode (NPPD) that includes a shallow region NPPD 414A in the semiconductor material 438 proximate to the front side 456 of the semiconductor material 438. First photodiode SPD 414 also includes a deep NPPD region (DNPPD) 414B in the semiconductor material 438 beneath the shallow region NPPD 414A and between the shallow region NPPD 414A of the first photodiode SPD 414 and the backside 454 of the semiconductor material 438.

In the example, the second photodiode LPD 416 is an outer photodiode and the first photodiode SPD 414 is an inner photodiode such that the second photodiode LPD 416 laterally surrounds the first photodiode SPD 414 in the semiconductor material 438 and such that the second photodiode LPD 416 has an inner perimeter that is proximate to an outer perimeter of the first photodiode SPD 414 in the semiconductor material 438.

A floating diffusion FD 456 is disposed in the semiconductor material 438 proximate to an outer perimeter of the second photodiode LPD 416. A first transfer gate TX1 418 is disposed proximate to the front side 456 of semiconductor material 438 over a first channel region 460 between the first and second photodiodes SPD 414 and LPD 416. The first transfer gate TX1 418 is coupled to transfer the image charge from the first photodiode SPD 414 to the second photodiode LPD 416 through the first channel region 460. A second transfer gate TX2 420 is disposed proximate to the front side 456 of semiconductor material 438 over a second channel region 462 between the second photodiode LPD 416 and the floating diffusion FD 422. The second transfer gate TX2 420 is coupled to transfer the image charge from the second photodiode LPD 416 to the floating diffusion FD 422. In one example, a thin gate oxide layer 448 is disposed between first and second transfer gates TX1 418 and TX2 420 and the front side 456 of semiconductor material 438.

The second photodiode LPD 416 is also an n-type pinned photodiode (NPPD) and includes a first shallow sub region NPPD 416A in the semiconductor material 438 proximate to the front side 456 of the semiconductor material 438. In the example, first shallow sub region NPPD 416A corresponds to first shallow subregion NPPD 316A in FIG. 3, and is therefore proximate to gap 334. Second photodiode LPD 416 in FIG. 4 also includes a second shallow subregion VP NPPD 416B in the semiconductor material 438 proximate to the first and second transfer gates TX1 418 and TX2 420, and proximate to the front side 456 of the semiconductor material 438. Second photodiode LPD 416 also includes a deep NPPD region DNPPD 416C in the semiconductor material 438 beneath the first and second shallow subregions NPPD 416A and VP NPPD 416B of the second photodiode LPD 416 and between the first and second shallow subregions NPPD 416A and VP NPPD 416B and the backside 454 of the semiconductor material 438. It is noted that in FIG. 4, it appears that there are two deep regions DNPPD 416C in the semiconductor material 438. However, it is appreciated that these are the same region because the cross-section intersects the same region twice as the region surrounds the first photodiode SPD 414 as illustrated with dashed line A-A' in FIG. 3.

In the example shown in FIG. 4, the second shallow subregion VP NPPD 416B of the second photodiode LPD 416 includes a virtual phase implant such that the second shallow subregion VP NPPD 416B of the second photodiode LPD 416 has a higher dopant concentration than the first shallow subregion NPPD 416A of the second photodiode LPD 416 contributing to the electric field gradient in the second photodiode LPD 416 that drives electrons from the first shallow subregion NPPD 416A towards the first and second transfer gates TX1 418 and TX2 420 in the second shallow subregion VP NPPD 416B of second photodiode LPD 416.

As shown in the depicted example, pixel cell 410 also includes a p-well (PW) region 444 disposed in the semiconductor material 438 around the first photodiode SPD 414 between the first photodiode SPD 414 and the second photodiode LPD 416 to isolate the first and second photodiodes from each other. In addition, a second p-well region 445 is disposed in the semiconductor material 438 surrounding the second photodiode LPD 416 to isolate the second photodiode LPD 416. Pixel cell 410 also includes a shallow trench isolation (STI) region 442 disposed in the semiconductor material 438 proximate to the front side 456 between the first photodiode SPD 414 and the second photodiode LPD 416 to isolate the first and second photodiodes SPD 414 and LPD 416 from each other. In addition, pixel cell 410 further includes backside deep trench isolation (BDTI) structures 440 disposed in the semiconductor material 438 extending from the backside 454 of the semiconductor material 438 towards a front side 456 of the semiconductor material 438 to isolate the first and second photodiodes SPD 414 and LPD 416.

The example pixel cell 410 illustrated FIG. 4 also shows that that a microlens 446 is disposed over the backside 454 of the semiconductor material 438 and centered over the first and second photodiodes SPD 414 and LPD 416 of pixel cell 410. In one example, the microlens 446 has a curved saddle-shaped cross-section that includes a thinner inner region, labeled in FIG. 4 as SPD region, that is aligned over the first photodiode SPD 414 such that the incident light 452 that passes through the thinner inner SPD region is directed from the microlens 446 through the backside 454 of the semiconductor material 438 and into the first photodiode SPD 414. The saddle-shaped cross-section of microlens 446 also includes a thicker outer region, labeled in FIG. 4 as LPD region, that surrounds the thinner inner SPD region, and is aligned over the second photodiode LPD 416 such that the incident light 450 that passes through the thicker outer LPD region is focused by the microlens 446 through the backside 454 of the semiconductor material 438 and into the second photodiode LPD 416. It is appreciated that the redirecting or focusing of the incident light 450 that enters the curved LPD region of the microlens 446 into the second photodiode 416 helps to reduce or eliminate unwanted crosstalk that would be caused by any of the incident light 450/452 otherwise entering a neighboring pixel cell of the pixel array.

Figure 5A:
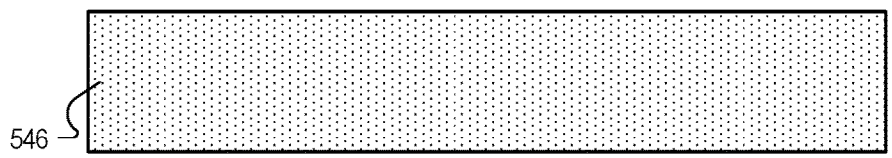
FIGS. 5A-5C show cross-section views of an example process to manufacture an example microlens included in an embedded split diode pixel cell in accordance with the teachings of the present invention.
Figure 5B:
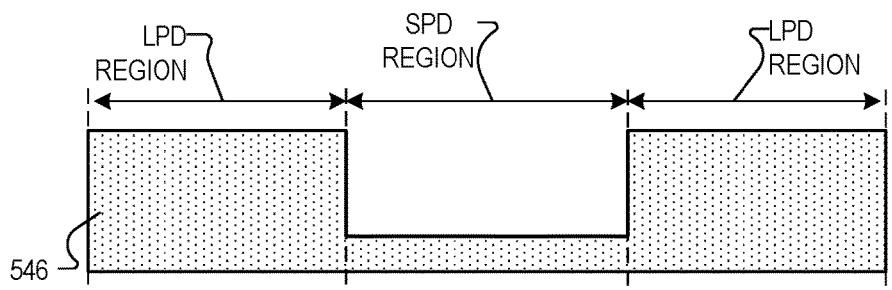
Figure 5C:
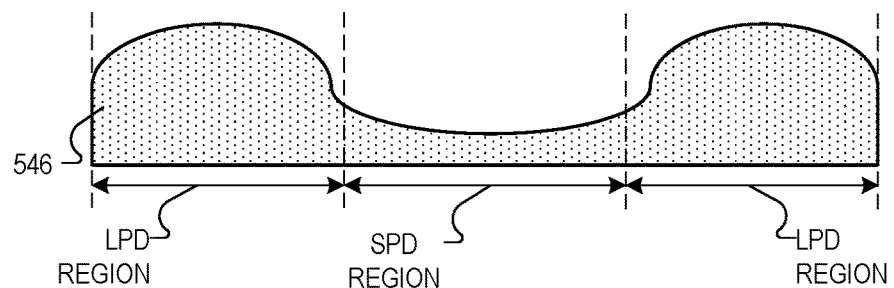

FIGS. 5A-5C show cross-section views of an example process to manufacture an example microlens 546 in accordance with the teachings of the present invention. It is appreciated that microlens 546 of FIGS. 5A-5C may be an example of microlens 446 included in pixel cell 410 of FIG. 4, or in example of pixel cell 310 of FIG. 3, or in example of pixel cell 210 of FIG. 2, or in example of pixel cell 110 of FIG. 1, and that similarly named and numbered elements referenced below may be coupled and function similar to as described above.

As shown in the example depicted in FIG. 5A, microlens 546 is initially a layer of microlens material, such as for example a polymer layer or other material suitable for use as a microlens.

FIG. 5B shows that an inner region of microlens 546, which is labeled as SPD region, is then formed, etched, or otherwise thinned into the center of the layer of the microlens material. The outer regions outside of the thinned center SPD region remain thicker and define the LPD region of microlens 546.

FIG. 5C shows that the microlens material of microlens 546 is then thermally reflowed, which causes the shape of microlens 546 to curve resulting in the saddle-shaped cross-section of microlens 546. As such, the outer LPD region is thicker and curved as shown, and surrounds thinner inner SPD region. As discussed, microlens 546 is aligned over a pixel cell as described previously in FIGS. 1-4 such that the thicker outer LPD region is aligned over the LPD photodiode and the thinner SPD region is centered and aligned over the SPD photodiode of the underlying pixel cell. Incident light that passes through the thicker outer LPD region of microlens 546 is focused into the underlying LPD photodiode and the incident light that passes through SPD region of microlens 546 is directed into the SPD photodiode of the underlying pixel cell.

Figure 6:
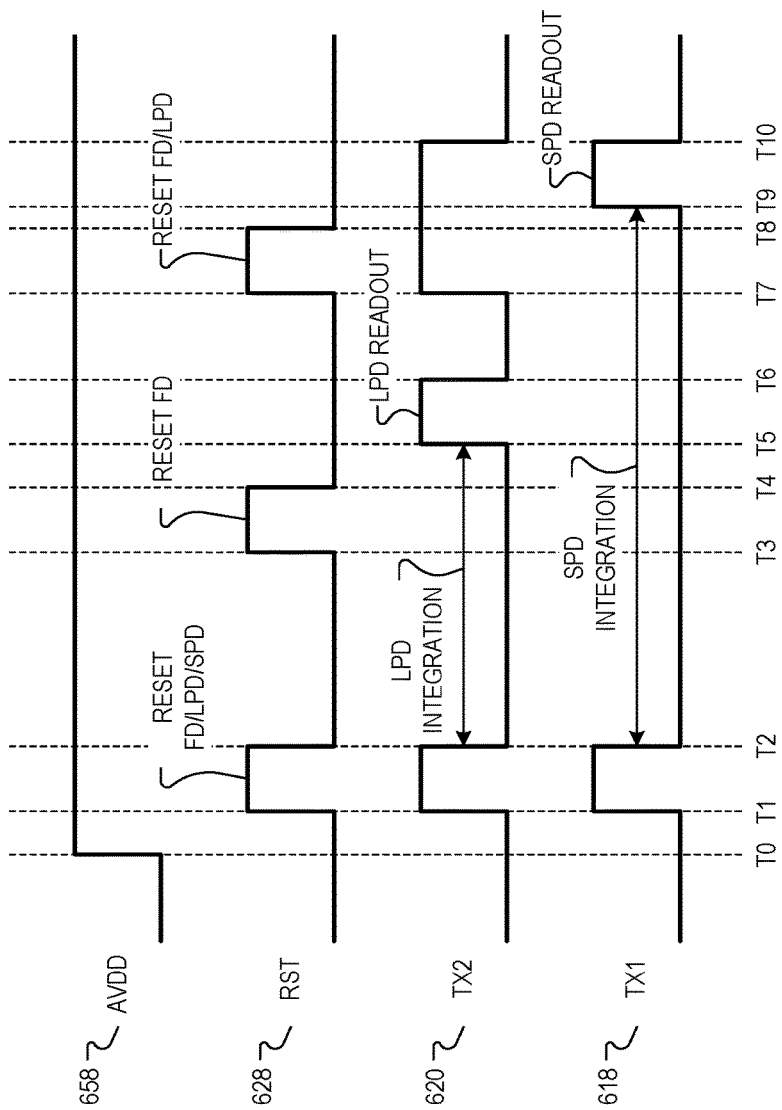
FIG. 6 is a timing diagram illustrating signals in an example embedded split diode pixel cell in accordance with the teachings of the present disclosure.

FIG. 6 is a timing diagram 660 illustrating signals in an example embedded split diode pixel cell in accordance with the teachings of the present disclosure. It is appreciated that signals described in FIG. 6 may be signals included in example pixel cell 410 of FIG. 4, or example of pixel cell 310 of FIG. 3, or example of pixel cell 210 of FIG. 2, or example of pixel cell 110 of FIG. 1, and that similarly named and numbered elements referenced below may be coupled and function similar to as described above. For instance, as shown in FIG. 2, pixel cell 210 includes an AVDD voltage supply signal 258, a reset signal RST coupled to control reset transistor 228, a first transfer gate signal TX1 coupled to control first transfer gate 218, and a second transfer gate signal TX2 coupled to control second transfer gate 220. Correspondingly, FIG. 6, shows an AVDD voltage supply signal 658, a reset signal 528, a first transfer gate signal TX1 618, and a second transfer gate signal TX2 620.

At time T0, the AVDD voltage supply 658 is active. At time T1, the reset signal RST 628, the second transfer gate control signal TX2 620, and the first transfer gate control signal TX1 618 are all turned on concurrently. At time T2, the reset signal RST 628, the second transfer gate control signal TX2 620, and the first transfer gate control signal TX1 618 are all turned off concurrently. As such, the first transfer gate, the second transfer gate, and the reset transistor are all adapted to be turned on and then turned off concurrently to reset the floating diffusion as well as the first and second photodiodes prior to integration of incident light in the first and second SPD and LPD photodiodes.

In operation, after the pixel has been reset between times T1 and T2, integration occurs in the LPD photodiode between time T2 and T5, and integration occurs in the SPD photodiode between time T2 and T9. However, before the LPD photodiode is read out beginning between time T5 and T6, the floating diffusion FD may be reset between time T3 and T4 with reset signal RST 628 turning on at time T3 and turning off at time t4. Then, at time T5, the second transfer gate control signal TX2 620 turns on allowing the transfer of image charge photogenerated in the LPD photodiode to the floating diffusion between time T5 and time T6 for a high conversion gain (HCG) readout of lower intensity incident light from the LPD photodiode. The second transfer gate control signal TX2 620 is then turned off at time T6.

Before the SPD photodiode is read out between time T9 and T10, the floating diffusion FD and LPD photodiode may be reset between time T7 and T8 with reset signal RST 628 and second transfer gate signal TX2 620 turning on at time T7 and the reset signal RST 628 turning off at time T8. The second transfer gate control signal TX2 620 remains turned on at time T8, and then at time T9 the first transfer gate signal TX1 618 is also turned on such that both the first and second transfer gates TX1 and TX2 are turned on concurrently allowing image charge in the SPD photodiode to be transferred to the LPD photodiode through the first transfer gate TX1, and then transferred to the floating diffusion FD through the second transfer gate TX2, which remained on at time T9, for a low conversion gate (LCG) readout of the higher intensity incident light from the SPD photodiode. Then at time T10, both the LPD photodiode and SPD photodiode have been read out, and the first and second transfer gate control signals TX1 618 and TX2 620 are turned off.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, comprising:
a first photodiode disposed in a semiconductor material;
a second photodiode disposed in the semiconductor material, wherein the second photodiode is an outer photodiode and the first photodiode is an inner photodiode such that the second photodiode laterally surrounds the first photodiode in the semiconductor material, wherein the second photodiode has an inner perimeter that is proximate to an outer perimeter of the first photodiode in the semiconductor material, wherein the first and second photodiodes are adapted to photogenerate image charge in response to incident light;
a floating diffusion disposed in the semiconductor material proximate to an outer perimeter of the second photodiode;
a first transfer gate disposed proximate to the semiconductor material over a first channel region between the first and second photodiodes, wherein the first transfer gate is coupled to transfer the image charge from the first photodiode to the second photodiode; and
a second transfer gate disposed proximate to the semiconductor material over a second channel region between the second photodiode and the floating diffusion, wherein the second transfer gate is coupled to transfer the image charge from the second photodiode to the floating diffusion.

2. The pixel cell of claim 1, further comprising:
a first p-well region disposed in the semiconductor material between the first photodiode and the second photodiode to isolate the first and second photodiodes from each other; and
a second p-well region disposed in the semiconductor material surrounding the second photodiode to isolate the second photodiode.

3. The pixel cell of claim 1, further comprising a shallow trench isolation (STI) region disposed in the semiconductor material between the first photodiode and the second photodiode to isolate the first and second photodiodes from each other.

4. The pixel cell of claim 1, wherein the second photodiode includes a gap in a region on a laterally opposite side of the second photodiode from the first and second transfer gates such that a dopant concentration in the second photodiode is reduced towards the gap away from the first and second transfer gates.

5. The pixel cell of claim 4, wherein the gap extends laterally from the output perimeter of the second photodiode towards the inner perimeter of the second photodiode.

6. The pixel cell of claim 5, wherein the gap extends completely from the outer perimeter of the second photodiode to the inner perimeter of the second photodiode.

7. The pixel cell of claim 1, wherein the incident light is directed to the first and second photodiodes through a backside of the semiconductor material.

8. The pixel cell of claim 1, wherein the first photodiode is an n-type pinned photodiode (NPPD) that comprises:
a shallow region in the semiconductor material proximate to a front side of the semiconductor material; and
a deep region in the semiconductor material beneath the shallow region and between the shallow region of the first photodiode and the backside of the semiconductor material, and
wherein the second photodiode is an n-type pinned photodiode (NPPD) that comprises:
a first shallow region in the semiconductor material proximate to the gap and proximate to the front side of the semiconductor material; and
a second shallow region in the semiconductor material proximate to the first and second transfer gates and proximate to the front side of the semiconductor material; and
a deep region in the semiconductor material beneath the first and second shallow regions of the second photodiode and between the first and second shallow regions and the backside of the semiconductor material.

9. The pixel cell of claim 8, wherein the second shallow region of the second photodiode includes a virtual phase implant such that the second shallow region of the second photodiode has a higher dopant concentration than the first shallow region of the second photodiode contributing to an electric field gradient in the second photodiode that drives electrons towards the first and second transfer gates in the second photodiode.

10. The pixel cell of claim 7, further comprising backside deep trench isolation (BDTI) structures disposed in the semiconductor material extending from the backside of the semiconductor material towards a front side of the semiconductor material to isolate the first and second photodiodes.

11. The pixel cell of claim 7, further comprising a microlens disposed over the backside of the semiconductor material and centered over the first and second photodiodes, wherein the microlens has a saddle-shaped cross-section including:
a thinner inner region aligned over the first photodiode such that the incident light passing through the thinner inner region is directed from the microlens through the backside of the semiconductor material into the first photodiode; and
a thicker outer region surrounding the thinner inner region and aligned over the second photodiode such that the incident light passing through the thicker outer region is focused by the microlens through the backside of the semiconductor material into the second photodiode.

12. The pixel cell of claim 1, further comprising:
a reset transistor coupled to the floating diffusion to reset the pixel cell in response to a reset signal;
an amplifier transistor having a gate terminal coupled to the floating diffusion to generate an image data signal in response to the image charge in the floating diffusion; and
a row select transistor coupled to the amplifier transistor to output the image data signal to an output bitline in response to a row select signal.

13. The pixel cell of claim 12, further comprising:
a dual floating diffusion transistor coupled between the floating diffusion and the reset capacitor; and
a capacitor coupled to the dual floating diffusion capacitor, wherein the dual floating diffusion transistor is adapted to couple the capacitor to the floating diffusion in response to a dual floating diffusion signal.

14. The pixel cell of claim 12, wherein the reset transistor, the first transfer gate, and the second transfer gate are all adapted to be turned on and then turned off concurrently to reset the floating diffusion and the first and second photodiodes prior to integration of the incident light in the first and second photodiodes.

15. The pixel cell of claim 14, wherein the second transfer gate is adapted to be turned on and then turned off after the integration of the incident light by the second photodiode to readout the image charge photogenerated in the second photodiode for a high conversion gain (HCG) readout of lower intensity incident light from the second photodiode.

16. The pixel cell of claim 15, wherein the first and second transfer gates are further adapted to be turned on concurrently after the HCG readout of the lower intensity incident light from the second photodiode and after the integration of the incident light by the first photodiode to transfer the image charge photogenerated in the first photodiode to the second photodiode, and to readout the image charge transferred from the first photodiode to the second photodiode for a low conversion gain (LCG) readout of higher intensity incident light from the first photodiode.

17. The pixel cell of claim 15, wherein the reset transistor is further adapted to be turned to reset the floating diffusion before the second transfer gate is turned on for the HCG readout.

18. The pixel cell of claim 16, wherein the reset transistor and the second transistor are both further adapted to be turned on concurrently after the HCG readout to reset the floating diffusion and the second photodiode after the HCG readout and before the first and second transfer gates are turned on concurrently for the LCG readout.

19. A high dynamic range (HDR) imaging system, comprising:
a pixel array of pixel cells, wherein each one of the pixel cells includes:

a first photodiode disposed in a semiconductor material;

a second photodiode disposed in the semiconductor material, wherein the second photodiode is an outer photodiode and the first photodiode is an inner photodiode such that the second photodiode laterally surrounds the first photodiode in the semiconductor material, wherein the second photodiode has an inner perimeter that is proximate to an outer perimeter of the first photodiode in the semiconductor material, wherein the first and second photodiodes are adapted to photogenerate image charge in response to incident light;

a floating diffusion disposed in the semiconductor material proximate to an outer perimeter of the second photodiode;

a first transfer gate disposed proximate to the semiconductor material over a first channel region between the first and second photodiodes, wherein the first transfer gate is coupled to transfer the image charge from the first photodiode to the second photodiode; and a second transfer gate disposed proximate to the semiconductor material over a second channel region between the second photodiode and the floating diffusion, wherein the second transfer gate is coupled to transfer the image charge from the second photodiode to the floating diffusion;

control circuitry coupled to the pixel array to control operation of the pixel array; and readout circuitry coupled to the pixel array to readout image data from the plurality of pixels.

20. The HDR imaging system of claim 19, further comprising function logic coupled to the readout circuitry to store image data from the pixel array.

21. The HDR imaging system of claim 19, wherein each pixel cell further comprises:

a first p-well region disposed in the semiconductor material between the first photodiode and the second photodiode to isolate the first and second photodiodes from each other; and a second p-well region disposed in the semiconductor material surrounding the second photodiode to isolate the second photodiode.

22. The HDR imaging system of claim 19, wherein each pixel cell further comprises a shallow trench isolation (STI) region disposed in the semiconductor material between the first photodiode and the second photodiode to isolate the first and second photodiodes from each other.

23. The HDR imaging system of claim 19, wherein the second photodiode includes a gap in a region on a laterally opposite side of the second photodiode from the first and second transfer gates such that a dopant concentration in the second photodiode is reduced towards the gap away from the first and second transfer gates.

24. The HDR imaging system of claim 23, wherein the gap extends laterally from the output perimeter of the second photodiode towards the inner perimeter of the second photodiode.

25. The HDR imaging system of claim 24, wherein the gap extends completely from the outer perimeter of the second photodiode to the inner perimeter of the second photodiode.

26. The HDR imaging system of claim 19, wherein the incident light is directed to the first and second photodiodes through a backside of the semiconductor material.

27. The HDR imaging system of claim 26, wherein the first photodiode is an n-type pinned photodiode (NPPD) that comprises:

a shallow region in the semiconductor material proximate to a front side of the semiconductor material; and a deep region in the semiconductor material beneath the shallow region and between the shallow region of the first photodiode and the backside of the semiconductor material, and wherein the second photodiode is an n-type pinned photodiode (NPPD) that comprises:

a first shallow region in the semiconductor material proximate to the gap and proximate to the front side of the semiconductor material; and a second shallow region in the semiconductor material proximate to the first and second transfer gates and proximate to the front side of the semiconductor material; and a deep region in the semiconductor material beneath the first and second shallow regions of the second photodiode and between the first and second shallow regions and the backside of the semiconductor material.

28. The HDR imaging system of claim 27, wherein the second shallow region of the second photodiode includes a virtual phase implant such that the second shallow region of the second photodiode has a higher dopant concentration than the first shallow region of the second photodiode contributing to an electric field gradient in the second photodiode that drives electrons towards the first and second transfer gates in the second photodiode.

29. The HDR imaging system of claim 26, wherein each pixel cell further comprises backside deep trench isolation (BDTI) structures disposed in the semiconductor material extending from the backside of the semiconductor material towards a front side of the semiconductor material to isolate the first and second photodiodes.

30. The HDR imaging system of claim 26, wherein each pixel cell further comprises a microlens disposed over the backside of the semiconductor material and centered over the first and second photodiodes, wherein the microlens has a saddle-shaped cross-section including:

a thinner inner region aligned over the first photodiode such that the incident light passing through the thinner inner region is directed from the microlens through the backside of the semiconductor material into the first photodiode; and a thicker outer region surrounding the thinner inner region and aligned over the second photodiode such that the incident light passing through the thicker outer region is focused by the microlens through the backside of the semiconductor material into the second photodiode.

31. The HDR imaging system of claim 19, wherein each pixel cell further comprises:

a reset transistor coupled to the floating diffusion to reset the pixel cell in response to a reset signal;

an amplifier transistor having a gate terminal coupled to the floating diffusion to generate an image data signal in response to the image charge in the floating diffusion; and a row select transistor coupled to the amplifier transistor to output the image data signal to an output bitline coupled to the readout circuitry in response to a row select signal.

* * * * *